United States Patent [19]
Saito

[11] Patent Number: 5,969,535
[45] Date of Patent: Oct. 19, 1999

[54] PROBE CARD WITH CONNECTOR

[75] Inventor: Shinichi Saito, Kawasaki, Japan

[73] Assignee: Hewlett-Packard Company, Palo Alto, Calif.

[21] Appl. No.: 08/932,154

[22] Filed: Sep. 17, 1997

[30] Foreign Application Priority Data

Sep. 30, 1996 [JP] Japan .................................. 8-257226

[51] Int. Cl.[6] ................................................ G01R 31/02
[52] U.S. Cl. ...................................... 324/758; 324/754
[58] Field of Search ................................ 324/754, 758, 324/755

[56] References Cited

U.S. PATENT DOCUMENTS

| | | | |
|---|---|---|---|
| 4,975,639 | 12/1990 | Hiwada et al. | 324/754 |
| 5,051,689 | 9/1991 | Hiwada et al. | 324/754 |
| 5,055,777 | 10/1991 | Bonelli et al. | 324/754 |
| 5,092,774 | 3/1992 | Milan | 324/761 X |
| 5,517,126 | 5/1996 | Yamaguchi | 324/758 |
| 5,546,405 | 8/1996 | Golla | 324/754 X |
| 5,572,144 | 11/1996 | Davidson et al. | 324/755 |

OTHER PUBLICATIONS

Membrane Probe Series, (Cascade Microtech), pp. 1–4, "RFIC Membrane Probe" (date unavailable).

*Primary Examiner*—Glenn W. Brown

[57] ABSTRACT

An improved probe card with connector includes a probe card and a detachable ring plate that includes at least one RF coaxial connector. The ring plate is secured to the probe card, via at least one stud. To secure the stud to the ring plate and the probe card, a screw or the like may be used. The RF coaxial connector on the ring plate is electrically connected, via a coaxial cable, to a coaxial connector which is positioned on the surface of the probe card.

15 Claims, 6 Drawing Sheets

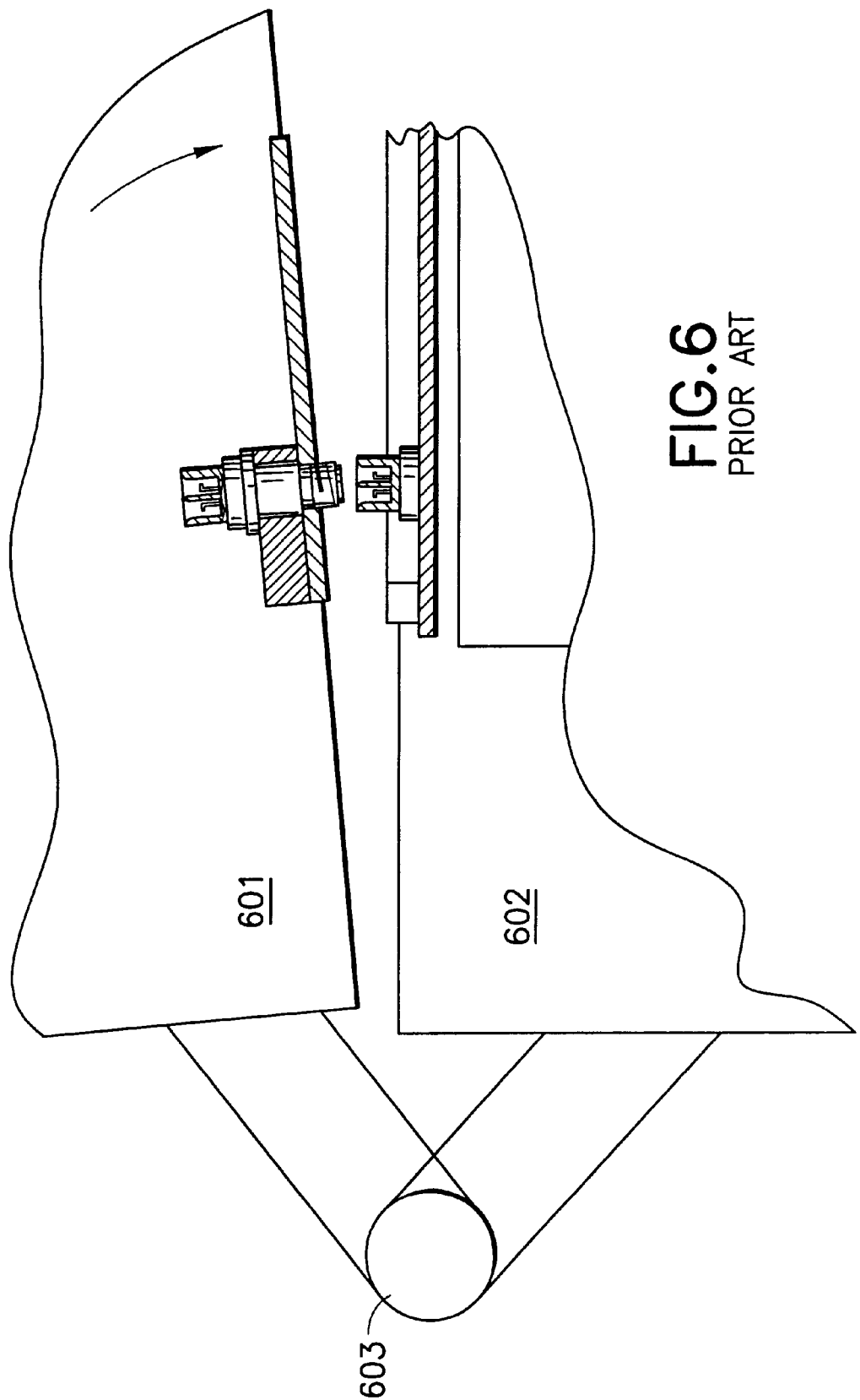

PROBE CARD WITH CONNECTOR

FIELD OF THE INVENTION

The present invention relates to an improved probe card apparatus in a semi-conductor test system and, more specifically, to an improved probe card apparatus having a coaxial connector for an RF band signal that allows a test head to be automatically connected to the prober and provides a coaxial connector for use with RF band signals.

BACKGROUND OF THE INVENTION

In recent years, with the advancements in semiconductor devices to be tested, there is an increasing demand for improvements in the performance of semiconductor test systems. Specifically, there is a need for test systems that can operate at frequencies in the RF band range (i.e., RF test signals) and perform even higher precision testing.

Conventional semi-conductor test systems generally include a test head which provides an interface between a mainframe of a testing equipment and a device under test (DUT), as well as a prober which makes positioning of the DUT. Usually, within the test head, a DUT board having a plurality of conductive pads is mounted onto the connecting surface to the prober for the electrical connection to the mainframe of the testing equipment. On the other hand, on the upper surface of the prober (the connecting surface to the test head) is mounted a connection ring through which a plurality of pogo pins pierce. A probe card having contact needles for probing the DUT is mounted on the prober side of the connection ring. The probe card is also equipped with a plurality of electrically conductive pads through which the probe card is electrically connected to the pogo pins of the connection ring.

The wafer on which the DUT is fabricated is normally located on the top of a prober chuck (wafer table). On testing, the test head and the prober are docked together, during which the pogo pins of the connection ring are compressed onto the electrically conductive pads which are arranged at predetermined places on the DUT board. In addition, the operation of the prober chuck causes the wafer to move to a position where the contact needle of the probe card makes contact with the DUT on the wafer. In this way, the test device and the DUT are electrically connected. That is to say, a reliable electrical connection can be made by using the method of pressing pogo pins against conductive pads, without utilizing a connector which has a latching mechanism such as engagement by snapping in or a screw like the SMB connector, the SMA connector or the like. The above arrangement has been indispensable in performing tests in which connection and disconnection between the test head and the prober are repeated automatically and successively.

When performing tests with DC signals and low frequency signals in a semi-conductor testing system, the testing accuracy can be maintained even with the above connection method. However, when handling RF band signals, the use of the pogo pins causes a reduction of frequency-response characteristic due to reflection loss and so forth. Accordingly, when handling RF band signals, an RF coaxial connector must be used for such connection. As is shown in FIG. 4 of the present application, RF coaxial connectors are assembled directly onto the probe card, and the operator must manually connect the connectors and the RF coaxial connectors on the test head side one by one. With this approach, a full automatic connection of the test head and the prober is impossible to accomplish, and intervention by the operator is required at the time of connection and disconnection. This causes a significant decrease in the test throughput.

Furthermore, the conventional connector is directly assembled to the conventional probe card, as shown in FIG. 4. Even when only one of the connectors breaks or becomes defective, replacement of the entire probe card or replacement of the broken connector is necessary. The replacement of the entire probe card is cost prohibitive; and the replacement of a broken connector is difficult because the connector is directly assembled to the probe card.

As shown in FIG. 6, in order to dock the test head with the prober, a hinge mechanism 603 is employed to link a test head 601 to a prober 602. However, automatic connection by way of a coaxial connector for RF band signals may not work properly. That is to say, at the moment the connector of the test head side is coupled to the connector of the prober side, if the connection surfaces are not parallel, then the central axes of the connectors of both sides are not aligned, resulting that these connectors may not connect smoothly.

One approach to remedy the above connection problem is through the use of a floating mount apparatus for the coaxial connector that is disclosed in a co-pending U.S. patent application Ser. No. 08/932,762 by the applicants entitled "Floating Mount Apparatus For Coaxial Connector," which is assigned to the same assignee as the present invention and incorporated herein by reference. FIG. 5 illustrates a cross-section of such a floating mount apparatus. That is, the central axis of the connector on the prober side tilts on connection with the central axis of test head by way of the free movement in any direction of the connector on the prober side, allowing appropriate tilt of the central axis.

However, when the floating mount apparatus of the coaxial connector is directly mounted onto the probe card, a protrusion in the form of a flange nut 506 (FIG. 5) extends outwards from the wafer side of the probe card and, thus, interferes with the wafer. It is also difficult to maintain coaxial structure in the connection to a pattern of the connectors on the probe card from the connectors on the test head side. Therefore, it is necessary to develop a new arrangement which can have the floating mechanism mounted onto the probe card without interfering with the wafer and can maintain a coaxial structure even in the connecting section to the trace on the probe card.

Another problem with such test systems is associated with the variation of the stroke of the probe chuck lifting depending on the models of probers. When a connection ring suited for one model of probers is used with some other model, even if the probe chuck of the other model is raised to its maximum height, the DUT still may not be able to reach the probe card. In this case, a new connection ring that matches the chuck lifting stroke of the other model of probers must be designed and manufactured. This causes the production cost of the connection ring to increase.

Accordingly, it is an object of the present invention to remedy the problems of the aforementioned prior art in the probe card.

It is a further object of the invention to provide an improved probe card with an RF coaxial connector which can be used to perform full automatic connection with the connector of the test head.

Another object of the invention is to provide a probe card apparatus that has the ability to improve the throughput of the test system.

SUMMARY OF THE INVENTION

An improved probe card with connector includes a probe card and a separate ring plate to which at least one RF coaxial connector is assembled. The ring plate is secured to the probe card, via at least one stud. To secure the stud to the ring plate and the probe card, a screw or the like may be used. The RF coaxial connector on the ring plate is electrically connected, via a coaxial cable, to a coaxial connector which is positioned on the surface of the probe card. Such an arrangement allows a defective RF connector to be easily removed and replaced, because the whole ring plate including the RF connectors can be detached from and re-attached to the RF probe card.

The present invention also allows a defective connector to be replaced with any unused connector on the ring plate on which the connectors are arranged in rotationally symmetrical form. That is to say, the ring plate is simply rotated until the unused connector lies in the original position of the defective connector. The unused connector can then be connected to the coaxial connector on the probe card. Therefore, the maintainability and cost performance of the overall system is improved because another connector on the ring plate can be easily substituted for a defective connector.

The present invention also makes it possible to mount the floating mount apparatus which previously could not be mounted because of the problems of interference to a wafer and the coaxial structure explained in the description of the prior art. The floating mount apparatus is attached to the plate disposed away from the probe card, which can then be electrically and mechanically coupled to the probe card. As such, the protruding flange nut of the floating mount apparatus no longer interferes with the wafer of the probe card. Therefore, the present invention makes it possible to perform an automatic connection of the prober and the test head which are hinge coupled.

BRIEF DESCRIPTION OF THE DRAWINGS

FIG. 6 illustrates a cross-sectional view of the hinge coupling of the prober and the test head of the prior art.

DESCRIPTION OF THE REFERENCE NUMERALS

101 RF Ring
102 RF Coaxial Connector
103 Ring Plate
104 Stud
105 Screw
106 RF Probe Card
107 Cable
108 Opening
109 Coaxial Connector
201 RF Connection Ring
202 Groove Component
301 Test Head
302 Prober
303 Hinge Mechanism
401 RF Probe Card
402 RF Coaxial Connector
501 Ring Plate
502 RF Probe Card
503 Blind Mate Connector
504 Coil Spring
505 Mount Hole
506 Flange Nut
507 RF Coaxial Connector
508 Stud
601 Test Head
602 Prober
603 Hinge Mechanism

PREFERRED EMBODIMENT OF THE INVENTION

Figure 1:
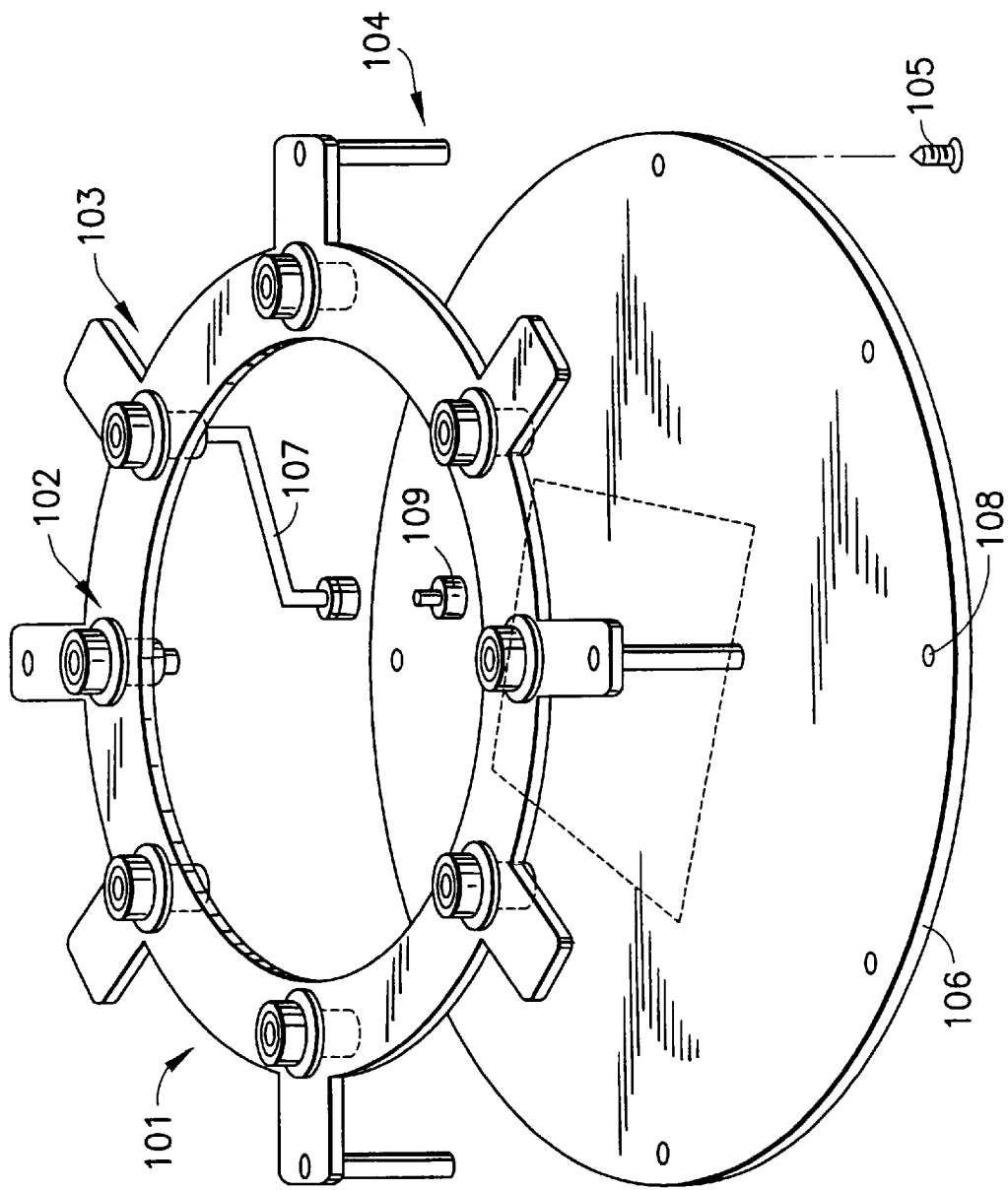
FIG. 1 illustrates an exploded perspective view of a probe card apparatus with RF coaxial connectors in accordance with the present invention.

FIG. 1 illustrates a preferred embodiment of a probe card apparatus in accordance with the present invention. The probe card apparatus includes an RF ring 101 and a probe card 106. RF ring 101 has a ring plate 103, an RF band signal connector 102 and a stud 104. In the preferred embodiment, ring plate 103, for example, has a circular shape and eight connectors 102 arranged in rotationally symmetrical form along its circumference such that any of the eight connectors can be utilized by simply rotating ring plate 103 to a desired connection position.

Note that the number of connectors 102 can be designed to match the design of the testing device. The shape of ring plate 103 can also be selected according to the shape of the DUT board which is mounted on the test head or to the shape of the connection ring which corresponds to such DUT board. For example, a multiangle shape such as a square may be utilized.

Ring plate 103 includes protruding components that extend radially towards the outer side from each position where the connectors among the periphery of ring plate 103 are attached. Stud 104 is attached to the protruding component of ring plate 103. Probe card 106 has at least one opening 108 which has screw threads cut and is positioned with respect to stud 104. Ring plate 103 can thus be secured to probe card 106, across stud 104 with a screw 105, as shown in FIG. 1.

As with the protruding components, the number of openings 108 arranged in rotationally symmetrical form on probe card 106 corresponds with at least the number of connectors 102. As ring plate 103 is rotated along the circumference direction on probe card 106, ring plate 103 can thus be attached to probe card 106 at different shifted positions.

In FIG. 1, the electrical connection to the base plate of probe card 106 from each connector 102 is achieved by connecting a connector 102 to a connector 109, via a coaxial cable 107. It is preferred that coaxial cable 107 can be easily attached to and removed from connector 109 in order to exchange RF ring 101 or to replace a defective connector. Such a configuration makes it possible to maintain a coaxial signal path.

Figure 2:
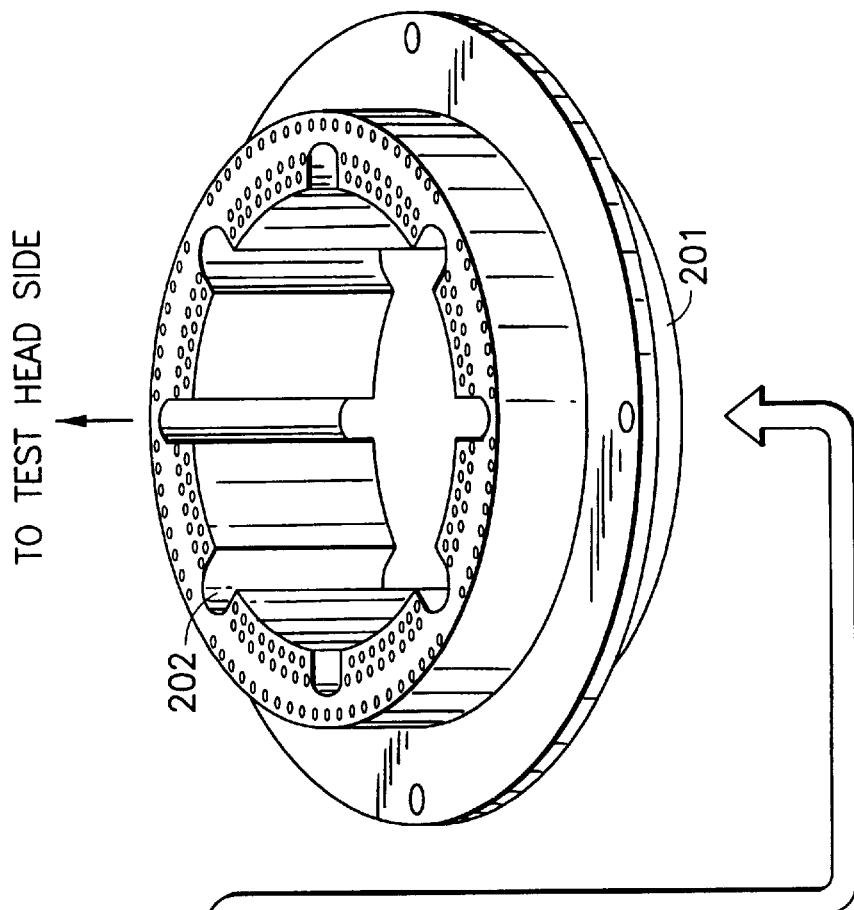
FIG. 2 illustrates an exploded perspective view of a probe card apparatus that includes a connection ring and probe card with RF coaxial connectors in accordance with the present invention.
Figure 2:
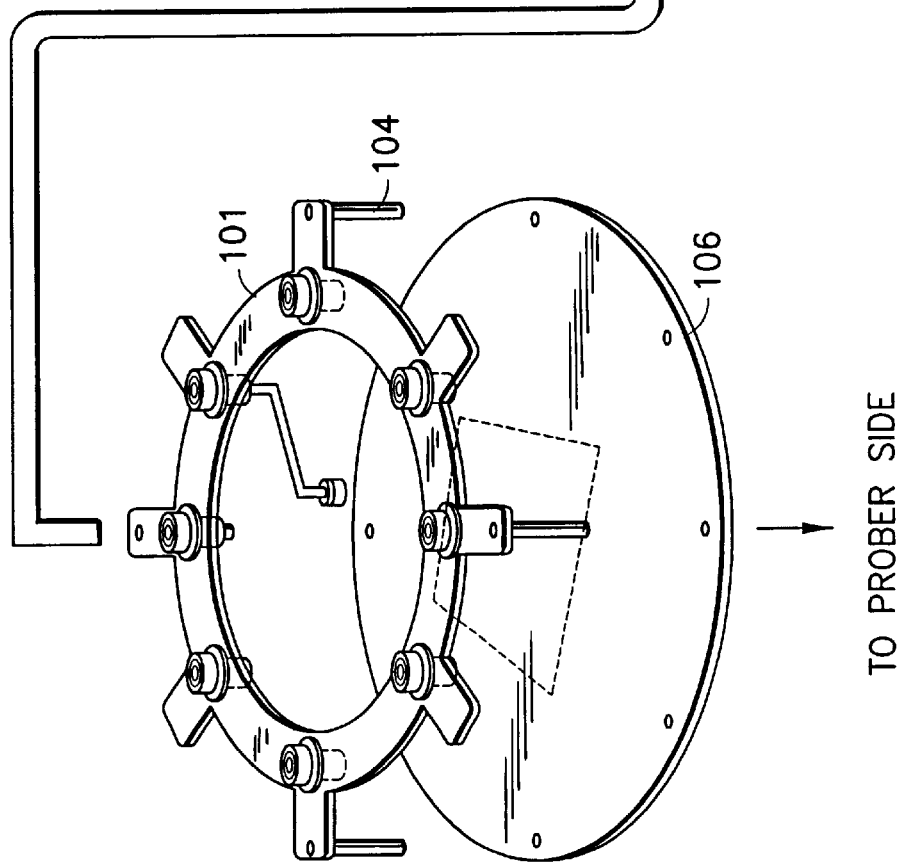

FIG. 2 illustrates the probe card with an RF ring and a connection ring 201 which may be combined therewith in accordance with the present invention. The inner surface of connection ring 201 is provided with grooves 202 arranged in a rotationally symmetric manner similar to the protrusions of the RF ring so that the protrusions of RF ring 101 may engage the grooves.

With the structure in which the RF connector is provided that is rotationally symmetric and detachable from the probe card, in case of defect in any connector, an emergency measure can be taken by removing the screws and rotating the ring until the unused connector comes to the position where the defective connector was originally located. Thus, if there is no stock of the ring plate for replacement and in an emergency situation, replacement of the connector may not be done for the time being. Furthermore, replacement of all the connectors due to wear can be very easily done by removing screws 105 and replacing them together with the ring plate 103.

In the event that all the connectors of ring plate 103 must be replaced for reasons such as wear or so forth, the entire ring plate 103 can also be replaced by simply unscrewing screw(s) 105 which disconnects ring plate 103 from probe card 106.

In addition, users of semi-conductor testing devices typically prepare and utilize various types of probe cards according to each DUT in order to test a variety of DUT types. By arranging the aforementioned construction into each probe card, there is provided a ring plate 103 that is compatible for each type of probe card, thus allowing a reduction in costs.

Different users usually use different models of probers, and thus the lifted heights of the chuck surfaces are different. Therefore, with a connection ring suited for a different prober, the chuck surface may not reach the surface of the probe card in some probers. In such a situation, a specially designed and manufactured connection ring with its sizes suited for such probers is needed, which causes a high cost.

The probe card apparatus of the present invention provides a unique solution to the problem of different heights of the prober chuck. As described above, stud 104 secures the RF ring to probe card 106 and can be attached and removed from both the ring plate and the probe card. By selecting and attaching studs of various lengths (i.e. a height adjusting means), it then becomes possible to freely set the distance between the surface of the probe chuck and the DUT board on the test head side (as described by the indicator arrow 304 of FIG. 3). Note that freely telescopic stud mechanisms may also be utilized. Therefore, a connection ring in accordance with the present invention may be utilized with many varieties of mechanical types of probers and can be designed and manufactured in just one size.

Figure 3:
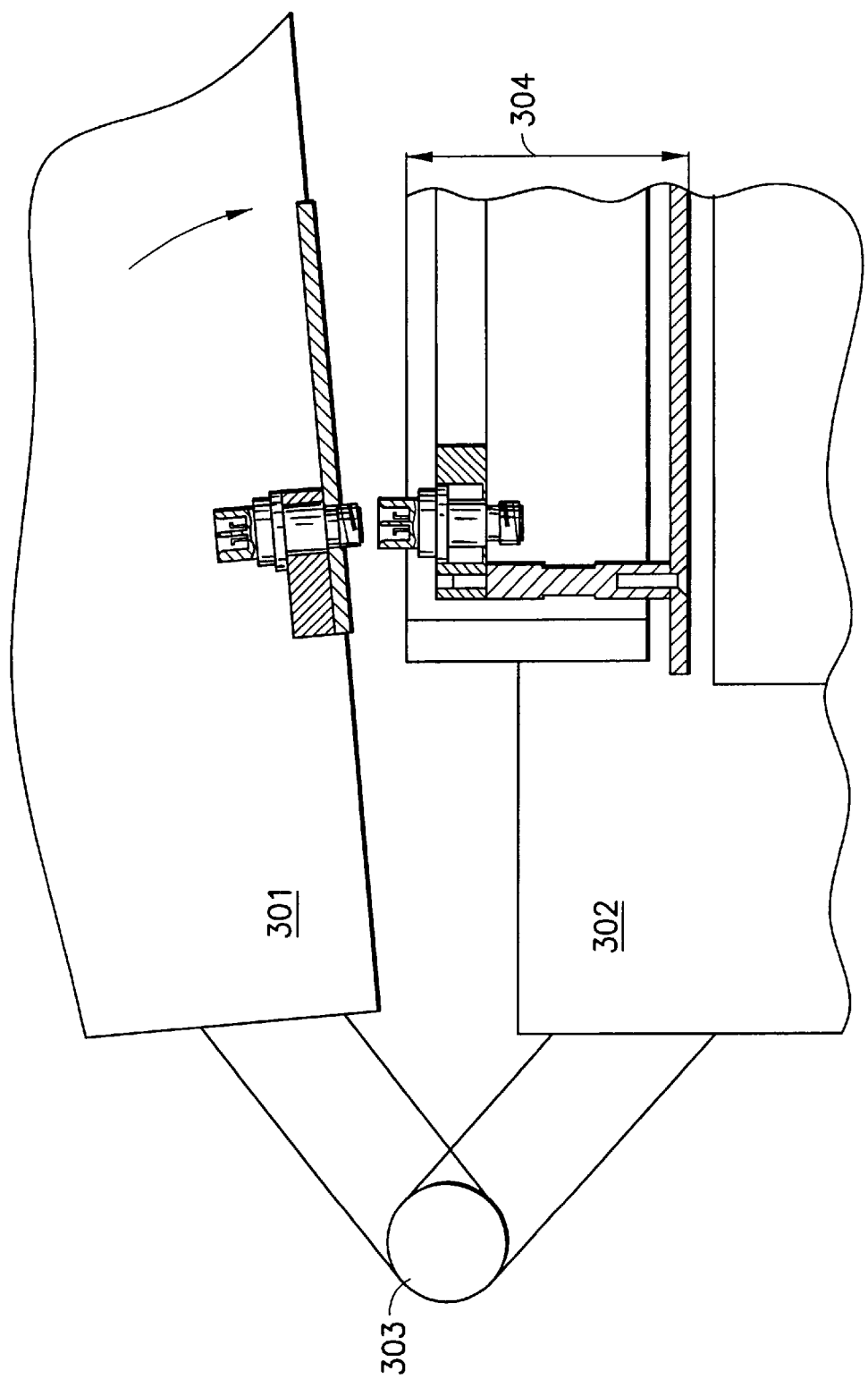
FIG. 3 illustrates a cross-sectional view of the hinge coupling of the probe card apparatus and the test head in accordance with the present invention.
Figure 4:
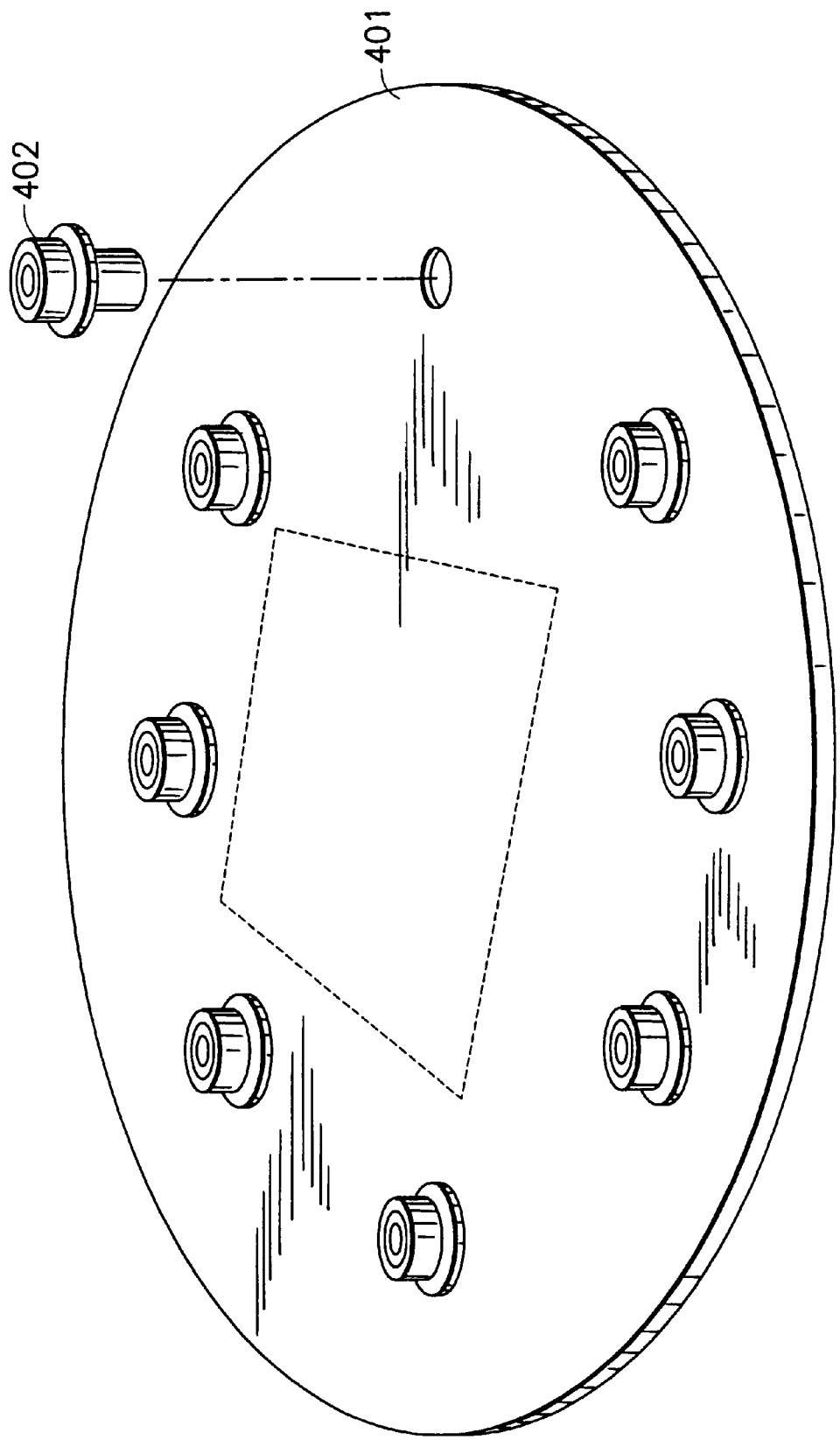
FIG. 4 illustrates a perspective view of the probe card with RF connectors of the prior art.
Figure 5:
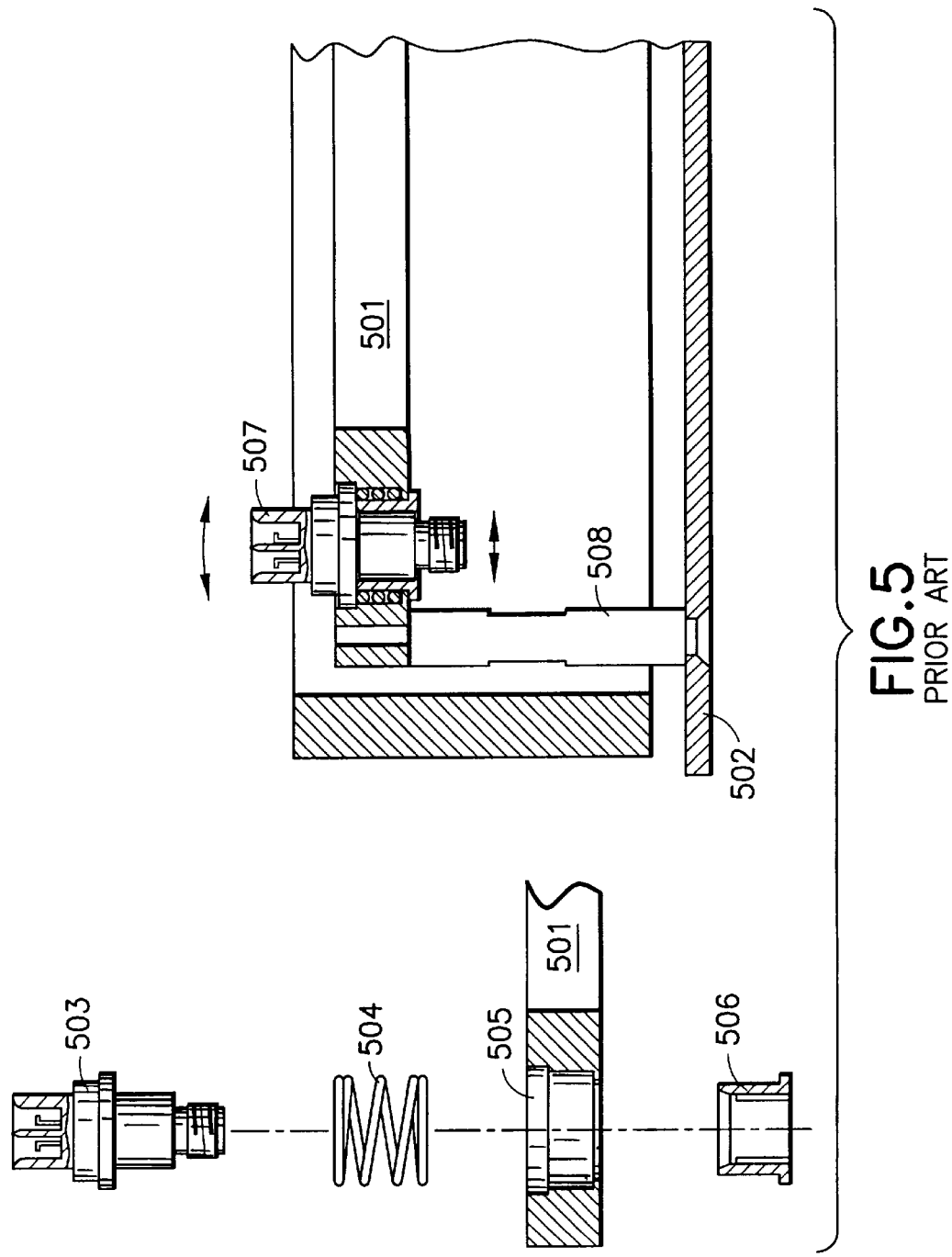
FIG. 5 illustrates a cross-sectional view of the floating mechanism.

FIG. 5 illustrates a floating mount apparatus for a snap-in type RF connector that has been incorporated into the ring plate of the present invention. The floating mount apparatus is disclosed in a co-pending U.S. patent application Ser. No. 08/932,762 "Floating Mount Apparatus For Coaxial Connector." The floating mount apparatus provides a coaxial connector and mount structure which allow the central axis of the coaxial connector to adjust in an appropriate directions to ensure a smooth, errorless engagement with an opposite connector on the test head, when the prober and the test head are docking (as shown in FIG. 3).

The floating mount apparatus includes a Blind Mate connector 503 which is a snap-in type RF coaxial connector that is currently being offered for sale by Hewlett Packard Japan, Ltd. Blind Mate connector 503 is supported by a mount hole 505 in the ring plate 501 through a flange nut 506 and a coil spring 504.

When mounting the floating mechanism directly to a standard probe card, a protrusion extends outwards towards the surface of the DUT side of the probe card and, thus, interferes with the DUT. However, the present invention provides a solution to the above problem. Instead of mounting the floating mount apparatus directly onto the probe card, the present invention mounts the floating mount apparatus onto ring plate 501 (FIG. 5). In addition, by mounting the floating mechanism to ring plate 501, the mount component becomes independent from probe card 502 and, thus, a mount hole can be designed which is not dependent on the thickness of the probe card.

In summary, the present invention makes it possible to achieve a fully automatic connection of a test head and a prober even with a test with RF band signals. The present invention also improves the throughput of a test as compared to that with the conventional probe card. The present invention also provides the following remarkable advantages:

(1) It enables the replacement of a defective coaxial connector to be done easily, because the connector can be replaced together with the ring plate as a unit.

(2) It enables the design for implementing the floating mechanism to be easy, which has been difficult on the probe card.

(3) The detachable stud for the probe card of the present invention makes the height of the probe card surface adjustable according to the different heights of the probe card surfaces.

(4) In the case that an unused RF connector is available on a ring plate, the rotational symmetric structure of the present invention enables the unused connector to be substituted for the defective one by shifting the ring plate by rotation. Thus, maintenance at low cost can be realized.

The invention having thus described with particular reference to the preferred embodiments thereof, it will be obvious that various changes and modifications may be made therein without departing from the spirit and scope of the invention as defined in the appended claims. For example, the number and position of the coaxial connectors on the ring plate can be designed appropriately for the specification of the semi-conductor testing device.

I claim:

1. A probe card apparatus with connector for testing devices, comprising:

a probe card;

a plate having at least one coaxial connector with a central axis for connecting to an opposing connector with a central axis of a test head, said at least one coaxial connector of said plate having means for adjusting said central axis of said at least one coaxial connector in a direction such that said central axis of said at least one coaxial connector is aligned with said central axis of said opposing connector; and means for connecting said plate to said probe card.

2. The probe card apparatus as recited in claim 1, wherein said means for connecting detachably connects said plate to said probe card.

3. The probe card apparatus as recited in claim 2, wherein said at least one coaxial connector is positioned on said plate such that said at least one coaxial connector is usable in plural positions by rotating said plate.

4. The probe card apparatus as recited in claim 1, wherein said means for connecting comprises at least one detachable stud.

5. The probe card apparatus as recited in claim 1, wherein said means for connecting includes height adjusting means for connecting said plate to said probe card at different heights.

6. A probe card apparatus with connector for testing devices, comprising:

a plate including a first connector with a central axis for connecting to a second connector with a central axis of a test head, said first connector having means for adjusting said central axis of said first connector in a direction such that said central axis of said first connector is aligned with a central axis of said second connector;

a probe card having a third connector;

means for connecting said plate to said probe card; and means for electrically connecting said third connector to said first connector.

7. The probe card apparatus as recited in claim 6, wherein said means for connecting detachably connects said plate to said probe card.

8. The probe card apparatus as recited in claim 7, wherein said first connector is positioned on said plate such that said first connector is usable in plural positions by rotating said plate.

9. The probe card apparatus as recited in claim 6, wherein said means for connecting comprises at least one detachable stud.

10. The probe card apparatus as recited in claim 6, wherein said means for connecting includes height adjusting means for connecting said plate to said probe card at different heights.

11. An apparatus for testing a device under test (DUT), comprising a test head, a prober, hinge means coupled to said test head and said prober for pivoting said test head and said prober towards and away from each other, and a DUT board detachably mounted to said test head, said DUT board including a second connector having a central axis, said apparatus further comprising:

a probe card apparatus including:

a plate having a first connector with a central axis, for connecting to said second connector, said first connector having means for adjusting said central axis of said first connector in a direction such that said central axis of said first connector is aligned with said central axis of said second connector, a probe card having a third connector electrically connected to said first connector, means for connecting said plate to said probe card, and said apparatus for testing a DUT including a connection ring for supporting said probe card apparatus on said prober.

12. The probe card apparatus as recited in claim 11, wherein said means for connecting detachably connects said plate to said probe card.

13. The probe card apparatus as recited in claim 12, wherein said first connector is positioned on said plate such that said first connector is usable in plural positions by rotating said plate.

14. The probe card apparatus as recited in claim 11, wherein said means for connecting comprises at least one detachable stud.

15. The probe card apparatus as recited in claim 11, wherein said means for connecting includes height adjusting means for connecting said plate to said probe card at different heights.

* * * * *

UNITED STATES PATENT AND TRADEMARK OFFICE
CERTIFICATE OF CORRECTION

PATENT NO. : 5,969,535
DATED : October 19, 1999
INVENTOR(S) : Shinichi Saito

It is certified that error appears in the above-identified patent and that said Letters Patent is hereby corrected as shown below:

Claim 11, Col. 8, lines 9 and 10 erroneously read as follows:

"connected to said first connector,
means for connecting said plate to said probe card, [and]"

Please correct to read as follows:

"connected to said first connector, and
means for connecting said plate to said probe card,"

Signed and Sealed this

Twenty-second Day of May, 2001

Attest:

NICHOLAS P. GODICI

Attesting Officer  Acting Director of the United States Patent and Trademark Office